United States Patent
Zhang et al.

(10) Patent No.: US 9,064,894 B2
(45) Date of Patent: Jun. 23, 2015

(54) STRESS ENHANCED HIGH VOLTAGE DEVICE

(75) Inventors: Guowei Zhang, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 13/569,190

(22) Filed: Aug. 8, 2012

(65) Prior Publication Data

US 2014/0042499 A1    Feb. 13, 2014

(51) Int. Cl.
| H01L 21/336 | (2006.01) |
|---|---|
| H01L 29/66 | (2006.01) |
| H01L 29/06 | (2006.01) |
| H01L 29/78 | (2006.01) |
| H01L 21/762 | (2006.01) |
| H01L 29/45 | (2006.01) |
| H01L 29/49 | (2006.01) |

(52) U.S. Cl.
CPC ....... H01L 29/66659 (2013.01); *H01L 29/0615* (2013.01); *H01L 29/0603* (2013.01); *H01L 29/7846* (2013.01); *H01L 21/76224* (2013.01); H01L 29/7843 (2013.01); *H01L 29/456* (2013.01); *H01L 29/4933* (2013.01); H01L 29/7835 (2013.01); H01L 29/0653 (2013.01)

(58) Field of Classification Search
CPC . H01L 21/762; H01L 21/76; H01L 21/76224; H01L 21/76283; H01L 29/0692; H01L 21/823878; H01L 21/76229; H01L 29/4238; H01L 29/7836; H01L 29/0603; H01L 29/0615; H01L 29/0638; H01L 29/7846; H01L 29/7847
See application file for complete search history.

(56) References Cited

U.S. PATENT DOCUMENTS

| 8,598,660 | B2 * | 12/2013 | Camillo-Castillo et al. .. | 257/343 |
|---|---|---|---|---|
| 2006/0121688 | A1 * | 6/2006 | Ko et al. ....................... | 438/439 |
| 2009/0224297 | A1 * | 9/2009 | Yi ................................. | 257/288 |
| 2010/0109097 | A1 * | 5/2010 | Zhang et al. .................. | 257/408 |
| 2010/0127321 | A1 * | 5/2010 | Ko ................................ | 257/327 |
| 2010/0164000 | A1 * | 7/2010 | Dove ............................. | 257/368 |

* cited by examiner

*Primary Examiner* — Benjamin Sandvik
*Assistant Examiner* — Leslie Pilar Cruz
(74) *Attorney, Agent, or Firm* — Horizon IP Pte. Ltd.

(57) ABSTRACT

A method of forming a device is disclosed. A substrate having a device region is provided. The device region comprises a source region, a gate region and a drain region defined thereon. A gate is formed in the gate region, a source is formed in the source region and drain is formed in the drain region. A trench is formed in an isolation region in the device region. The isolation region underlaps a portion of the gate. An etch stop (ES) stressor layer is formed over the substrate. The ES stressor layer lines the trench.

22 Claims, 17 Drawing Sheets

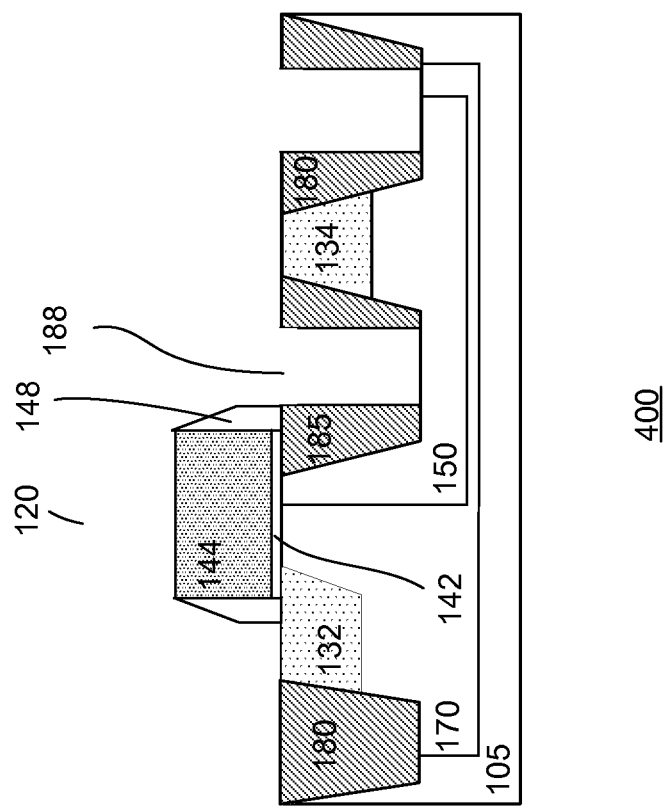

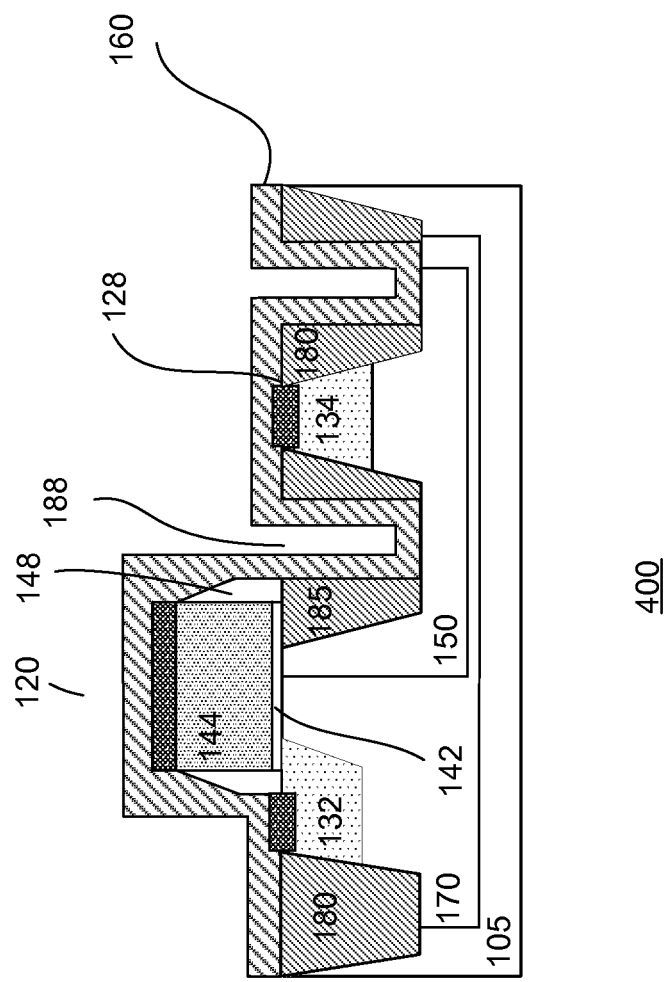

STRESS ENHANCED HIGH VOLTAGE DEVICE

BACKGROUND

Lateral Double-Diffused (LD) transistors have been widely employed in high voltage applications. The performance of the LD transistors depends on the drain-to-source on-resistance ($R_{dson}$) as well as breakdown voltage. For example, low $R_{dson}$ results in high switching speed while high breakdown voltage increases voltage capabilities.

Conventional techniques in achieving high breakdown voltage results in an increased distance between the drain and the gate. This, however, concomitantly increases $R_{dson}$, undesirably decreasing switching speed.

The disclosure is directed to transistors with fast switching speed and high breakdown voltage.

SUMMARY

A method of forming a device is disclosed. In one embodiment, the method includes providing a substrate having a device region. The device region is defined with a source region, a gate region and a drain region. The method also includes forming a gate in the device region, a source in the source region and a drain in the drain region. The method also includes forming a trench in an isolation region in the device region. The isolation region underlaps a portion of the gate. The method further includes forming an etch stop (ES) stressor layer over the substrate. The ES stressor layer lines the trench.

In one embodiment, a method of forming a semiconductor device is disclosed. The method includes providing a substrate having a device region. The device region is defined with a source region, a gate region and a drain region. The method also includes forming a gate in the device region, a source in the source region and a drain in the drain region. The drain is separated from the gate on a second side of the gate and the source is adjacent to a first side of the gate. The method also includes forming a trench in an isolation region in the device region. The isolation region underlaps a portion of the gate. The method further includes forming an etch stop (ES) stressor layer over the substrate. The ES stressor layer lines the trench.

In yet another embodiment, a semiconductor device is disclosed. The semiconductor device includes a substrate having a device region. The device region is defined with a source region, a gate region and a drain region. The semiconductor device also includes a trench in an internal isolation region in the device region. The internal isolation region underlaps a portion of a gate. The semiconductor device further includes an etch stop (ES) stressor layer over the substrate. The ES stressor layer lines the trench.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, various embodiments of the present invention are described with reference to the following drawings, in which:

FIGS. 3a-l show a process for forming an embodiment of a device;
and
FIGS. 4a-c show a process for forming another embodiment of a device.

DETAILED DESCRIPTION

Embodiments generally relate to semiconductor devices or integrated circuits (ICs). More particularly, some embodiments relate to high power devices. For example, high power devices include lateral double-diffused (LD) transistors, such as metal oxide transistors (MOS). The high power devices can be employed as switching voltage regulators for power management applications. The LD transistors can be easily integrated into devices or ICs. The devices or ICs can be incorporated into or used with, for example, consumer electronic products, particularly portable consumer products, such as cell phones, laptop computers and personal digital assistants (PDAs).

Figure 1:
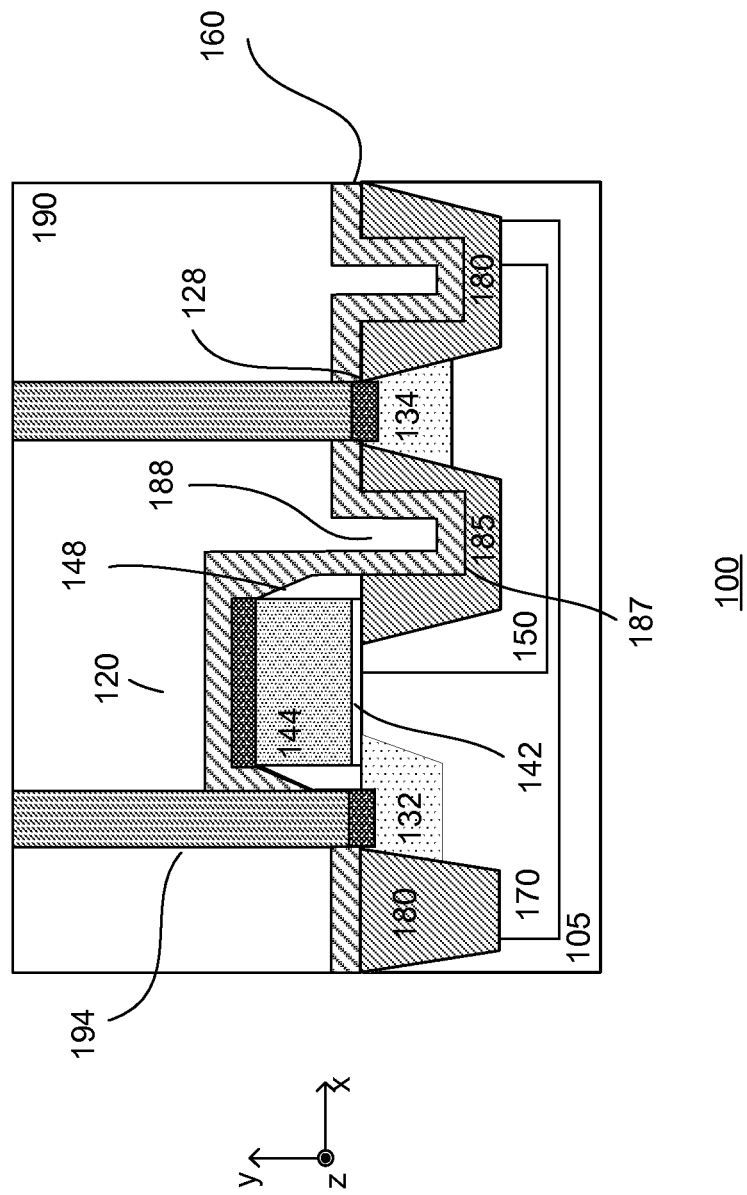
FIG. 1 shows an embodiment of a device.
Figure 2:
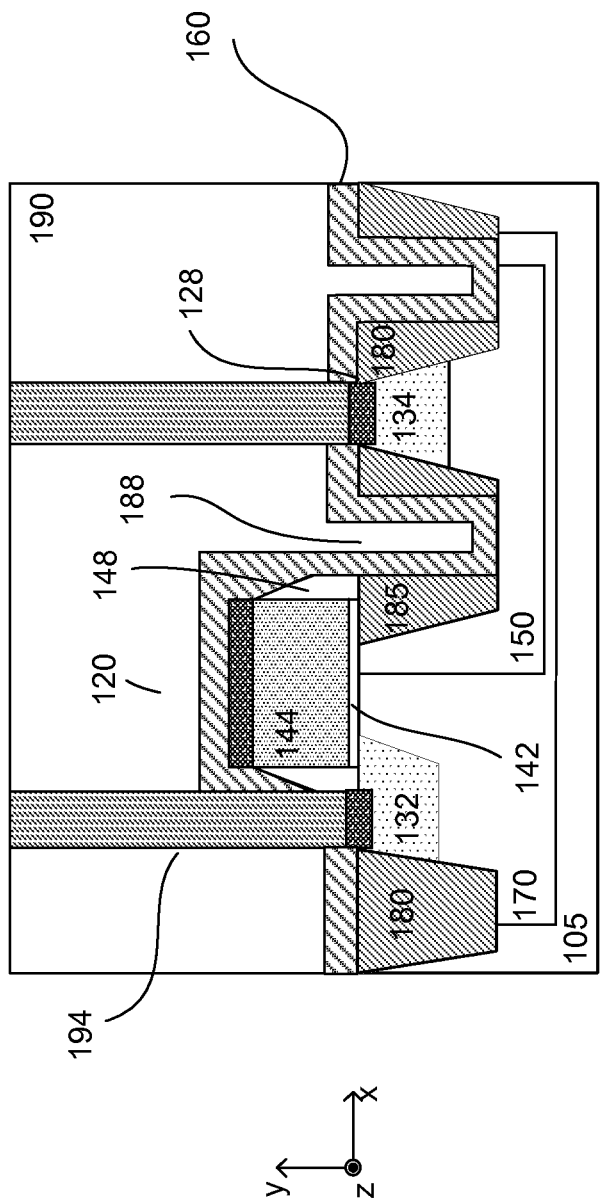
FIG. 2 shows another embodiment of a device.

FIGS. 1-2 show cross-sectional views of portions of different embodiments of a device 100. The device, for example, is an IC. Other types of devices may also be useful. As shown, the device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate maybe a doped substrate. For example, the substrate can be lightly doped with p-type dopants. Providing a substrate with other types of dopants or dopant concentrations as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about 1E11-1E13/cm$^2$, and an intermediately doped region may have a dopant concentration of about 1E13-E14/cm$^2$, and a heavily doped region may have a dopant concentration of about 1E14-1E17/cm$^2$. Providing other dopant concentrations for the different doped regions may also be useful. P-type dopants may include boron (B), aluminum (Al), indium (In) or a combination thereof, while n-type dopants may include phosphorous (P), arsenic (As), antimony (Sb) or a combination thereof.

The substrate includes a device region. The device region, for example, is a high voltage (HV) device region for a high voltage device, such as a high voltage transistor. In one embodiment, the device region includes a LD transistor 120. Providing other types of devices in the device region may also be useful. The substrate may also include regions for other types of circuitry, depending on the type of device or IC. For example, the device may also include regions for intermediate voltage (IV) and low voltage (LV) devices as well as an array region for memory devices.

Isolation regions may be provided for isolating or separating different regions of the substrate. In one embodiment, the device region is isolated from other regions by a device isolation region 180. For example, the device isolation region surrounds the device region. The isolation region, for example, is a shallow trench isolation (STI) region. An STI region includes an isolation trench filled with isolation or dielectric materials. Other types of isolation regions may also be employed. For example, the isolation region may be a deep trench isolation (DTI) region. The STI regions, for example, extend to a depth of about 2000-5000 Å. In the case of DTI regions, the depth may be about 1-10 μm. Providing isolation regions which extend to other depths may also be useful.

The transistor includes a gate 140 on the surface of the substrate. The gate, for example, traverses the device region along the z direction. The width of the gate along a channel length direction of the transistor may be about 0.1-50 μm. As shown, the channel direction is in the x direction. The x and z directions, for example, are orthogonal directions. The gate, in one embodiment, includes a gate electrode 144 over a gate dielectric 142. The gate dielectric, for example, may be silicon oxide while the gate electrode may be polysilicon. The gate dielectric, for example, may be a high voltage gate dielectric having a thickness of about 60-1000 Å while the gate electrode may be about 700-5000 Å thick. In some embodiments, the gate electrode may be a doped electrode. For example, the gate electrode may be polysilicon doped with first polarity type dopants. Other types of gate dielectrics and gate electrodes as well as thicknesses may also be useful. For example, the gate dielectric may be a high k gate dielectric and/or the gate electrode may be a metal gate electrode. Other configurations of gate layers of the gate may also be useful.

The transistor also includes first and second doped regions 132 and 134 disposed in the substrate on first and second sides of the gate. For example, the first doped region is disposed on the first side of the gate and the second doped region is disposed on the second side of the gate. The doped regions, in one embodiment, are heavily doped with first polarity type dopants for a first type transistor. For example, the doped regions are heavily doped n-type $n^+$ regions for a n-type transistor. Providing heavily doped p-type ($p^+$) regions may also be useful for a p-type transistor. The heavily doped regions, for example, have a dopant concentration of about $1E15$-$1E16/cm^2$. Other dopant concentrations for the doped regions may also be useful. The depth of the doped regions may be about 0.1-0.4 μm. Providing doped regions having other depths may also be useful. Additionally, it is not necessary that the first and second doped regions have the same depth.

In one embodiment, the first doped region serves as a source region of the transistor. The source region is adjacent to the first side and underlaps the gate. The underlap portion should be sufficient for the source region to be in communication with the channel under the gate. The underlap portion may be, for example, about 0.1-0.3 μm. An underlap portion which underlaps the gate by other amounts may also be useful. In one embodiment, the underlap portion of the source region is a lightly doped source (LDS) region.

Sidewalls of the gate may be provided with dielectric spacers 148. The dielectric spacers, for example, may be silicon oxide spacers. Other types of dielectric materials may also be useful, such as silicon nitride or a combination of dielectric materials or layers. For example, the spacers may be composite spacers. The spacers may include an offset spacer and main spacer. The offset spacers may facilitate forming the LDS region while the main spacers facilitate forming heavily doped source and drain regions. Other configurations of spacers may also be useful. For example, the spacer may be a single spacer. The LDS region is formed prior to forming the spacers while the spacers facilitate forming the heavily doped source and drain regions. In some cases, the transistor may include a halo region. The halo region is a second polarity doped region abutting the source region proximate to the gate.

In one embodiment, an internal isolation region 185 is provided within the device region. The internal isolation region may be an STI region. Other types of isolation regions may also be useful. Preferably, the internal isolation region is the same type of isolation region as the device isolation region. Providing an internal isolation region which is different from the device isolation region may also be useful. The internal isolation region, for example, is disposed in the device region along the z direction between the gate and drain. The internal isolation, for example, extends from one side to the other side of the device region along the z direction. Other configurations of the device and internal isolation regions may also be useful. As shown, the internal isolation region underlaps the gate. For example, the internal isolation region extends under the second side of the gate by about 0.1-2 μm. Providing an internal isolation region which extends under the second side of the gate by other width may also be useful. Providing the internal isolation region which underlaps the gate protects the edge of the gate dielectric from high electric field during operation. The width of the internal isolation region, for example, may be about 0.5-10 μm. Other widths may also be useful, depending on the drain voltage. The width and depth of the internal isolation region may determine a drift length of the transistor.

A drift well 150 is disposed in the substrate. The drift well, in one embodiment, is disposed in the device region. For example, the drift well is disposed between the gate and the drain region, under-lapping a portion of the gate. As shown, the drift well encompasses the drain and the internal device isolation region. In one embodiment, the depth or bottom of the drift well is below the drain region. In one embodiment, the depth or bottom of the drift well is below the device isolation and internal device isolation regions. In one embodiment, the drift well is contiguous and encompasses the drain region and at least overlaps a portion of the active region underneath the gate. The distance from the drain and around the internal isolation region to the channel under the gate is the drift distance of the transistor.

The drift well includes first polarity type dopants. In one embodiment, the dopant concentration of the drift well is lower than the dopant concentration of the drain. In one embodiment, the drift well may be lightly ($x^-$) or intermediately (x) doped with first polarity type dopants. For example, the dopant concentration of the drift well is about $1E12$-$1E14/cm^2$. Other dopant concentrations may also be useful. For example, the dopant concentration may depend on the maximum or breakdown voltage requirement of the device. The depth of the drift well may be about 0.5-5 μm depending on the design voltage of the device.

A device well 170 is disposed in the substrate. In one embodiment, the device well is disposed within the device isolation region. For example, the device well is disposed within the device isolation region, encompassing the source, drain, drift well and internal device isolation region. In one embodiment, the depth or bottom of the device well is below the source, drain and drift well. In one embodiment, the depth or bottom of the device well is below the device isolation region and internal device isolation region. Providing a device well which is shallower than or at the same depth as the drift well may also be useful. In one embodiment, the device well has about the same depth as the drift well. For example, the device well may be on both sides of the drift well. Other configurations of the device and drift well may also be useful. For example, the device well may only be on one side of the drift well encompassing the source region and channel of the device.

The device well includes second polarity dopants for a first polarity type device. For example, the device well comprises p-type dopants for an n-type device or n-type dopants for a p-type device. The dopant concentration may depend on the voltage requirement of the device. The device well may be lightly ($x^-$) or intermediately (x) doped with second polarity type dopants. Other dopant concentration for the device well, for example, dopant concentration greater than that of the lightly doped substrate, may also be useful.

Metal silicide contacts 128 may be provided on terminals or contact regions of the transistor. For example, metal silicide contacts may be provided on the gate electrode, source and drain. The silicide contacts, for example, may be nickel-based silicide contacts. Other types of metal silicide contacts may also be useful. For example, the metal silicide contact may be cobalt silicide (CoSi). The silicide contacts may be about 50-300 Å thick. Other thickness of silicide contacts may also be useful. The silicide contacts may be employed to reduce contact resistance and facilitate contact to the back-end-of-line metal interconnects.

In one embodiment, secondary trenches 187 are disposed in the dielectric material of the isolation regions adjacent to the second doped region. For example, secondary trenches are provided in the internal isolation region and device isolation region. As shown in FIG. 1, the secondary trenches extend partially into the isolation regions. Alternatively, as shown in FIG. 2, the secondary trenches extend to a bottom of the isolation regions. The secondary trenches accommodate a stressor layer for enhancing stress applied to the channel and drift region of the device. The deeper the trench, the more effective the stressor is in enhancing the stress applied to the channel and drift region of the device. In one embodiment, the depth of the secondary trenches may be about 90-100% the depth of the isolation regions. Providing secondary trenches having other depths shallower than the isolation regions may also be useful. The depth of the secondary trenches in the isolation regions, in one embodiment, is about the same. Providing the secondary trenches which have different depths may also useful.

Referring back to FIGS. 1-2, an etch stop (ES) stressor layer 160 is disposed over the substrate, lining the substrate, transistor and the secondary trenches in the isolation regions. The ES stressor layer is a dielectric layer. In one embodiment, the ES stressor layer induces a first stress on the channel of a first type transistor. The first stress, in one embodiment, is a tensile stress for a n-type transistor. The tensile stress of the ES stressor layer improves carrier mobility for n-type transistor. In one embodiment, the ES stressor layer is formed of a dielectric stress layer. In one embodiment, the ES stressor layer is a silicon nitride stressor layer. Other types of ES stressor layers may also be useful. For example, the ES stressor layer may be a silicon oxynitride stressor layer. In one embodiment, the ES stressor layer is a multi-layered stack. The multi-layered stack may include, for example, silicon nitride layer and silicon oxide layer.

The ES stressor layer lines the secondary trenches. In one embodiment, the ES stressor lines the secondary trenches without filling them. For example, the ES stressor layer leaves a gap 188 in the secondary trenches. The thickness of the ES stressor layer, for example, is about 300-1000 Å. Other thicknesses may also be useful. The thickness of the ES stressor layer should be sufficient to enhance carrier mobility in the channel and drift region of the transistor. Other configurations of stressors and secondary trenches may also be useful.

A dielectric layer 190 is disposed on the substrate, covering the transistor and filling the gaps in the secondary trenches. The dielectric layer, in one embodiment, serves as a pre-metal dielectric (PMD) layer. The dielectric layer, for example, is a silicon oxide layer. In one embodiment, the dielectric layer is a high aspect ratio process (HARP) dielectric material. Other types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). The dielectric layer should be capable of selectively etched or patterned with respect to the ES stressor layer.

The PMD layer includes contacts to contact regions of the transistor. For example, contacts plugs 194 are provided in the PMD layer to the gate electrode (not shown), source and drain. The contact plugs, for example, may be tungsten contact plugs. Other types of conductive contact plugs may also be useful.

An inter-metal dielectric (IMD) layer (not shown) may be provided over the PMD layer. The IMD layer, for example, may be silicon oxide. Other types of IMD dielectric materials may also be useful. An etch stop layer may be provided between the IMD and PMD layers. The IMD layer may include conductive lines disposed in the IMD layer which interconnect to the contact plugs. Other configurations of IMD and PMD layers may also be useful.

As described, an ES stressor layer is provided in the secondary trench in the isolation region. This enables it to be in closer proximity to the channel and drift region, effectively enhancing the stress effect of the ES stressor layer to improve carrier mobility and reducing $R_{dson}$. Furthermore, reduced $R_{dson}$ is achieved without increasing the dopant concentration of the drift well, avoiding negatively affecting the breakdown voltage of the transistor junction.

Figure 3A:
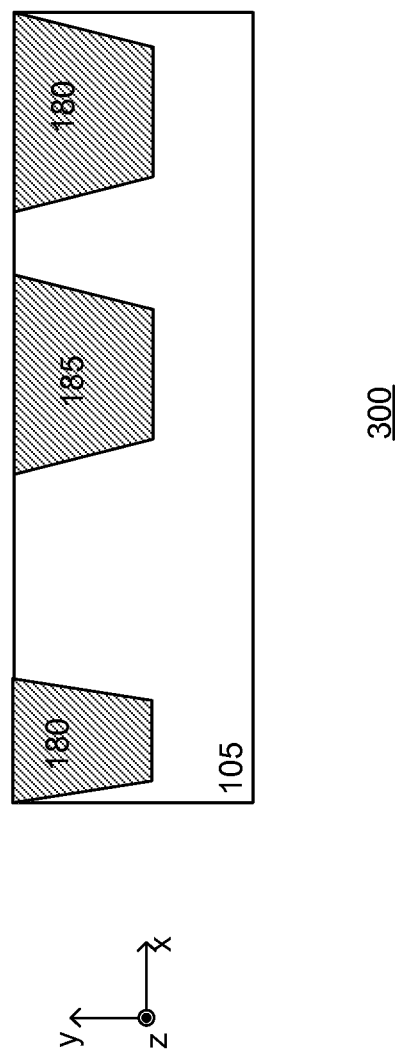

FIGS. 3a-k show cross-sectional views of an embodiment of a process for forming a device 300. The device, for example, is similar to that described in FIG. 1. As such, common elements may not be described or described in detail. Referring to FIG. 3a, a substrate 105 is provided. The substrate, in one embodiment, is a silicon substrate. The substrate may be a doped substrate, such as a $p^-$ substrate. Other types of substrates, such as a germanium-based, gallium arsenide, sapphire, or COI such as SOI, may also be useful. The substrates may be doped with other types of dopants or dopant concentrations, including undoped substrates.

As shown, a device region is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided.

In one embodiment, the device region is a HV region. The device region, for example, serves as a device region for a LD transistor. Providing a device region for other types of devices may also be useful. The device region is separated from other regions by a device isolation region 180. The device isolation region surrounds the device region. In one embodiment, the device region also includes an internal device isolation region 185 to separate the device region into first and second device sub-regions. For example, the internal device isolation region separates the device region into first and second sub-regions on the surface of the substrate. The internal device region, for example, extends along the z direction from one side to the other side of the device isolation region.

The isolation regions are, for example, STI regions. Various processes can be employed to form the STI regions. For example, the substrate can be etched using etch and mask techniques to form isolation trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 3000-5000 Å. Other depths for the STIs may also be useful. In other embodiments, the isolation may be other types of isolation regions. Also, the device and internal isolation regions may be different types of isolation regions.

Figure 3B:
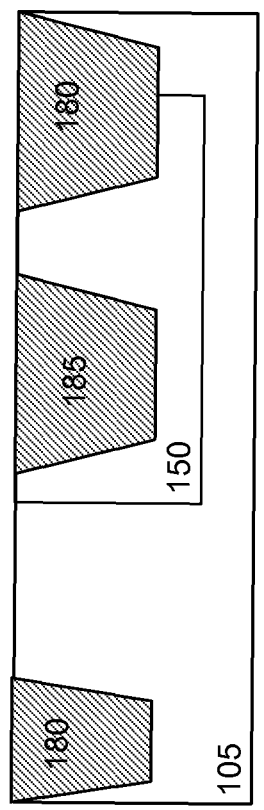

As shown in FIG. 3b, a doped well 150 is formed in the device region. The doped well serves as a drift well for the device. In one embodiment, the drift well is disposed in a portion of the device region. The drift well, for example, encompasses the internal isolation region and a portion of the device isolation region on a second side of the device region. The depth of the drift well, for example, may be about 0.5-5 µm. Providing a drift well of other depths may also be useful. The depth of the drift well, for example, may depend on the device operation voltage. The drift well includes first polarity type dopants for a first polarity type device. For example, a n-type drift well is provided for a n-type device. The n-type drift well, for example, may include phosphorus dopants. Forming a p-type drift well for a p-type device may also be useful. In one embodiment, the drift well may be lightly or intermediately doped with first polarity type dopants. Other dopant concentration for the drift well may also be useful.

Figure 3C:
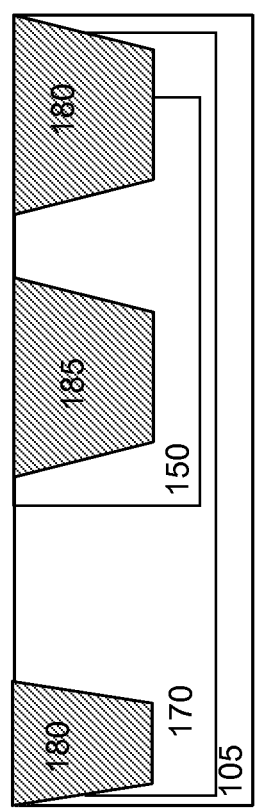

In some embodiment, a device well 170 is formed in the device region, as shown in FIG. 3c. The device well serves as a body well for the transistor. The device well includes second polarity type dopants. In one embodiment, the device well is a lightly doped device well. For example, the dopant concentration of the device well is about 5E12-5E13/cm$^2$. The device well, in one embodiment, encompasses the drift well and internal isolation region. In one embodiment, the device well encompasses a portion of the device isolation region, internal isolation region and drift well. The depth of the device well, for example, is about 0.5-5 µm. Other depths for the device well may also be useful. In other embodiments, the device well and drift well may have about the same depth. For example, the device well may be on both sides of the drift well. Other configurations of the device and drift well may also be useful. The device well, for example, may only be on one side of the drift well encompassing the source region and channel of the device.

To form a doped well, an implant mask which exposes the device region is used. The implant mask, for example, comprises photoresist patterned by a lithographic mask. Dopants are implanted into the substrate using the implant mask. The dopants are implanted with the appropriate dose and power. Separate implant processes with respective implant masks are used to form doped wells of different polarity types. For example, separate processes are used to form the drift and device wells. In one embodiment, the device well is formed prior to forming the drift well. In some embodiments, a doped well may be formed by, for example, performing multiple implants at different energies. For example, the device well may be formed using multiple implant processes. Other configurations of implant processes may also be employed to form the wells.

The implant processes used to form the doped wells may be compatible or the same as processes used to form other similar types of wells in the device. For example, the processes may be compatible with those used in current CMOS processes for forming similar types of wells. For example, the device well may be formed at the same time as the low voltage device well or intermediate voltage device well. This allows the same lithographic mask of the current CMOS implant mask to be used to pattern the implant mask for the device well. For example, the current CMOS implant mask may be customized to include the device well opening. In other embodiments, a separate device well mask may be used to specifically tailor for the doping of the device well. In such cases, the same mask can also be used to form the second device well.

An anneal is performed. In one embodiment, the anneal is performed after the drift and device wells are formed. The anneal activates the dopants. In other embodiments, separate anneals may be performed for the drift and device wells. For example, an anneal may be performed after forming a doped well.

Figure 3D:
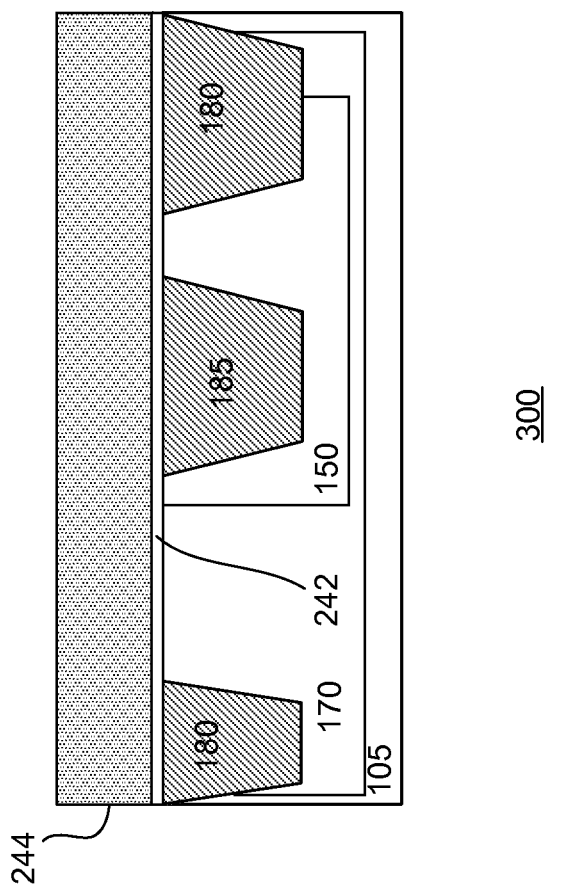

As shown in FIG. 3d, gate layers of a gate are formed on the substrate. In one embodiment, the gate layers include a gate dielectric layer 242 on the substrate and a gate electrode layer 244 thereon. The gate dielectric layer, for example, is silicon oxide. The thickness of the gate dielectric layer may be about 60-1000 Å. For example, the gate dielectric layer is a high voltage gate dielectric layer. The gate dielectric layer may be formed by thermal oxidation. For example, the dielectric layer is formed by wet oxidation followed by annealing the substrate in an oxidizing ambient. The temperature of the wet oxidation can be, for example, about 600-900° C. The annealing can be, for example, performed at a temperature of about 600-1000° C.

As for the gate electrode layer, it may be polysilicon. The thickness of the gate electrode layer may be about 700-5000 Å. Other thickness may also be useful. The gate electrode layer may be formed by, for example, CVD. Other techniques for forming the gate electrode layer may also be useful. The gate electrode layer can be formed as an amorphous or non-amorphous layer. In one embodiment, the gate electrode layer is polysilicon doped with first type dopants. The concentration of dopants in the gate electrode layer may be about 1E15-1E17/cm$^2$. Various techniques may be employed to dope the gate electrode layer, for example, in-situ doping or ion implantation.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode layers may have multiple layers. The layers can be formed by various techniques, such as thermal oxidation, CVD and sputtering.

Figure 3E:
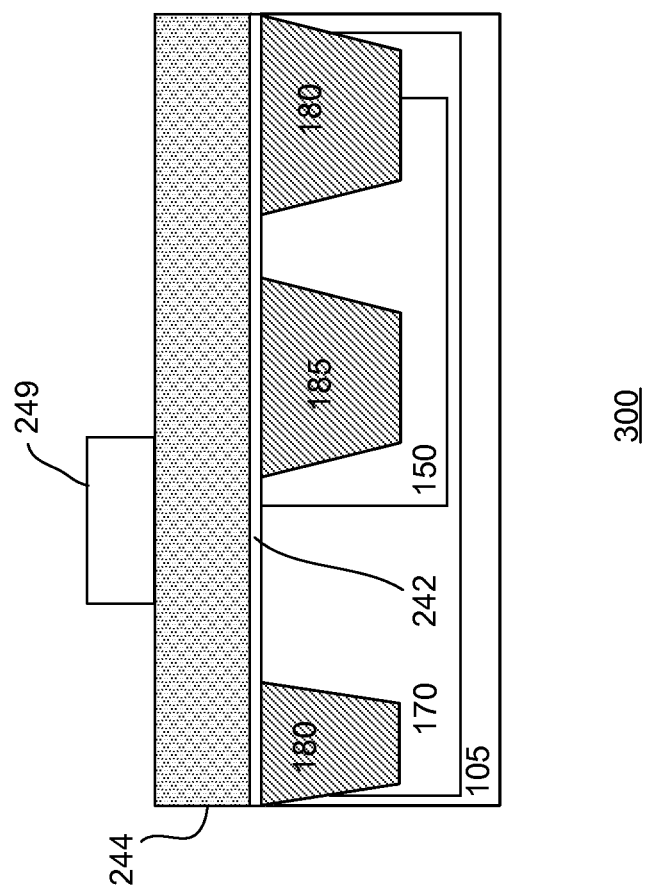

Referring to FIG. 3e, a mask layer 249 is formed on the substrate. The mask layer, for example, is formed over the gate electrode layer. In one embodiment, the mask layer is a soft mask layer, such as a photoresist layer. An exposure source may selectively expose the photoresist layer through a reticle containing the desired pattern. After selectively exposing the photoresist layer, it is developed to form openings corresponding to location when the gate layers are to be removed. To improve lithographic resolution, an anti-reflective coating (ARC) may be used below the photoresist layer.

In other embodiments, the mask layer may be a hard mask layer. The hard mask layer, for example, may comprise TEOS or silicon nitride. Other types of hard mask materials may also be used. The hard mask layer may be patterned using a soft mask, such as a photoresist.

Figure 3F:
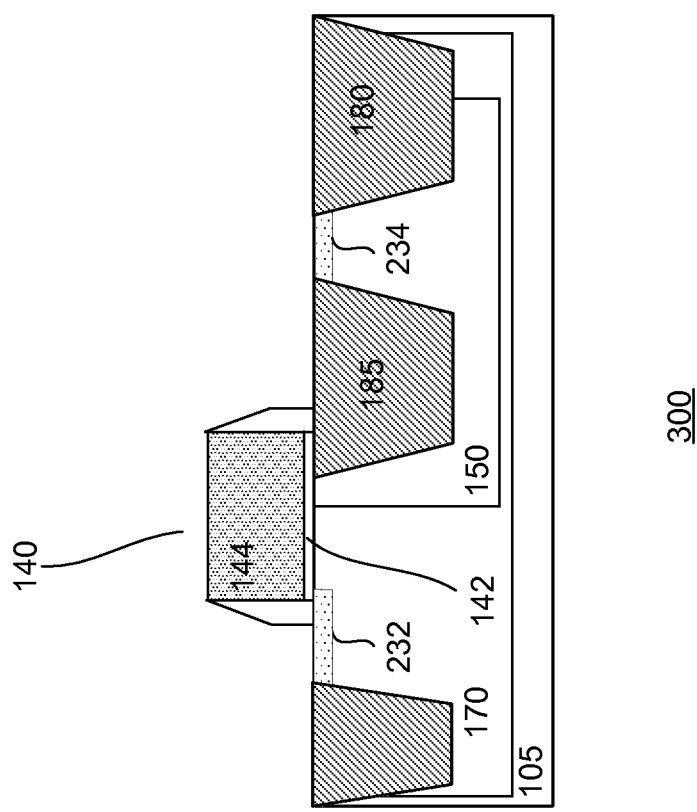

The patterned mask layer serves as an etch mask for a subsequent etch process, as shown in FIG. 3f. For example, the etch transfers the pattern of the mask to the gate layers. The etch removes the gate layers unprotected by the mask, exposing the substrate. The etch, for example, may be an anisotropic etch, such as reactive ion etch (RIE). Other types of etch processes may also be useful. In one embodiment, an RIE is employed to pattern the gate layers to form a gate 140 having a gate electrode 144 and gate dielectric 142.

In one embodiment, lightly doped regions 232 and 234 are formed in the substrate in the source and drain regions of the device. The lightly doped regions have first polarity type dopants. To form the lightly doped regions, first polarity type dopants are implanted into the substrate. The implant, for example, may be self-aligned with respect to the device region. For example, the implant may be doped into the substrate unprotected by the gate and isolation regions. The depth of the lightly doped regions, for example, is about 0.1-0.4 μm. The implant dose may be from about 5E12-5E13/cm$^2$ and the implant energy may be from 10-100 KeV. Other implant parameters may also be useful.

Sidewall spacers 148 are formed on the sidewalls of the gate. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, 300-1000 Å. Other thickness for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. In some applications, the spacer may be formed from multiple dielectric layers.

Figure 3G:
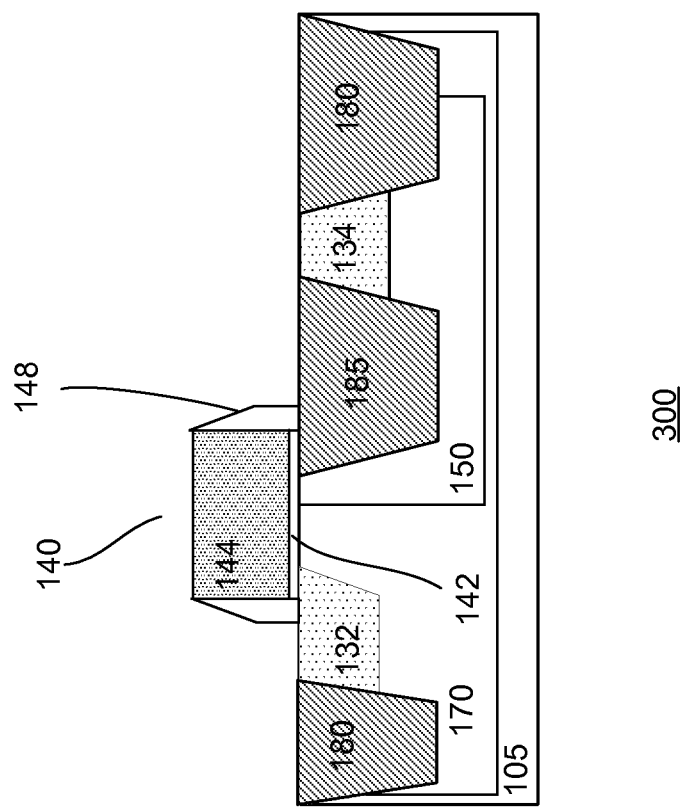

Referring to FIG. 3g, heavily doped regions 132 and 134 are formed in the source and drain regions on the substrate. The heavily doped regions have first polarity type dopants. Forming the heavily doped regions include implanting first polarity type dopants into the substrate. The implant, like the one that forms the lightly doped regions, is self-aligned with respect to the device region. For example, the implant may be doped into the substrate unprotected by the gate and isolation regions. In this case, the sidewall spacers cause the heavily doped source region to be offset, creating a source which includes a lightly doped source portion and a heavily doped deeper portion. The depth of the lightly doped regions, for example, is about 0.1-0.4 μm. The implant dose may be about 1E15-1E17/cm$^2$ and the implant energy may be 10-100 KeV. Other implant parameters may also be useful. This forms a LD transistor 120.

Figure 3H:
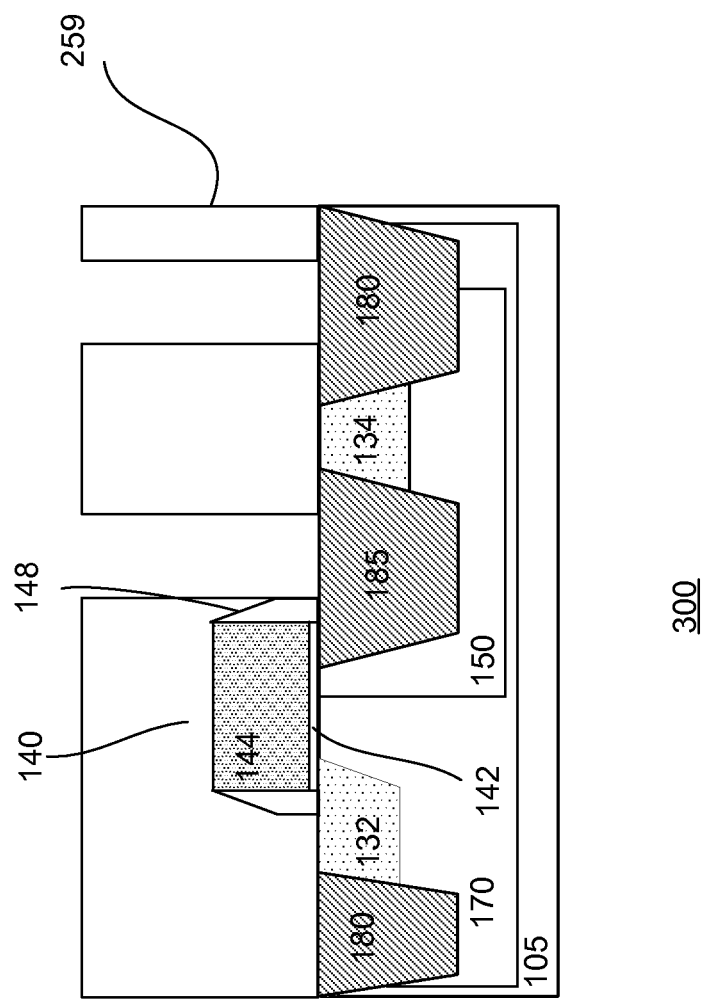

Referring to FIG. 3h, a mask layer 259 is formed on the substrate. In one embodiment, the mask layer is a soft mask layer, such as a photoresist layer. An exposure source may selectively expose the photoresist layer through a reticle containing the desired pattern. After selectively exposing the photoresist layer, it is developed to form openings corresponding to location where secondary trenches are formed in the isolation regions. To improve lithographic resolution, an anti-reflective coating (ARC) may be used below the photoresist layer.

Figure 3I:
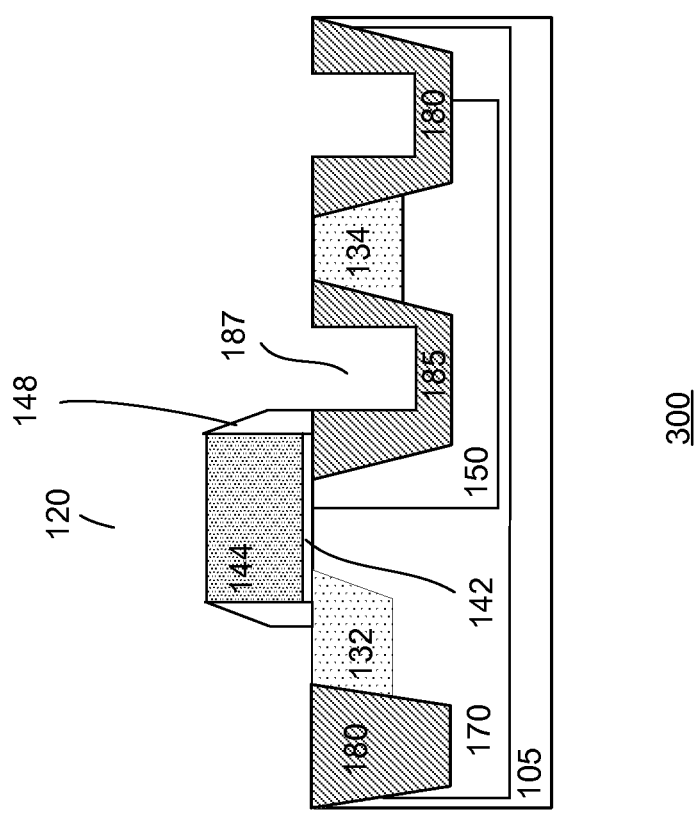

The patterned mask layer serves as an etch mask for a subsequent etch process. The etch removes the portions of isolation regions unprotected by the mask. The etch, for example, may be an anisotropic etch, such as reactive ion etch (RIE). Other types of etch processes may also be useful. In one embodiment, an RIE is employed to recess the isolation regions to form secondary trenches 187 in the isolation regions, as shown in FIG. 3i. As shown, the isolation regions are partially recessed to form the secondary trenches. For example, isolation material forms a bottom of the secondary trenches. The depth of the secondary trenches, for example, may be at least 90% the depth of the isolation regions. Providing secondary trenches of other depths may also be useful. The depth of the secondary trenches may be the same or similar. Providing the secondary trenches of different depths may also be useful. This may, however, require separate mask and etch processes.

Figure 3J:
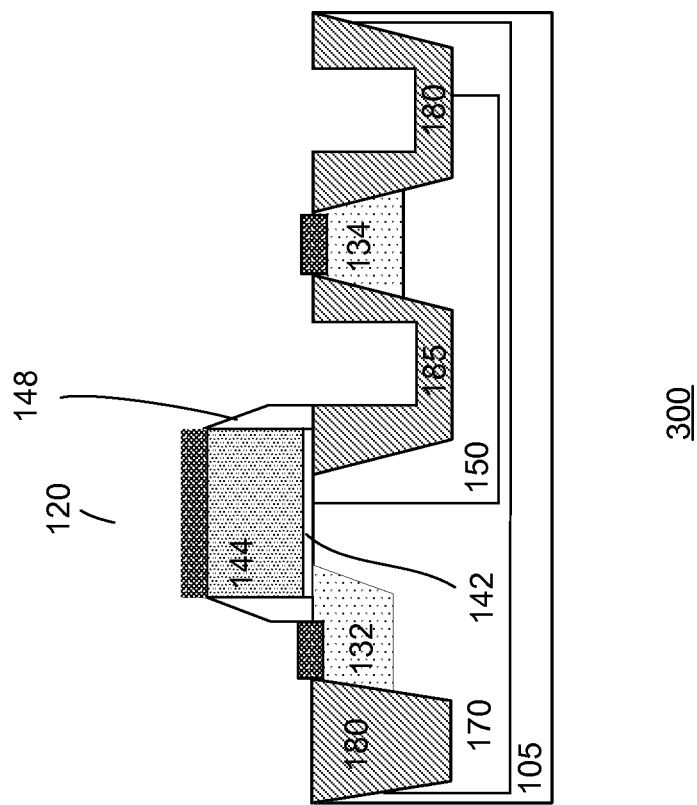

In one embodiment, silicide contacts 128 are formed on contact regions of the transistor as shown in FIG. 3j. For example, the silicide contacts are formed on the gate and source and drain of the transistor. The silicide contacts are to facilitate low resistance contacts between the active substrate and the BEOL metal lines. In one embodiment, the thickness of the silicide contacts is about 50-300 Å. Providing other thicknesses may also be useful.

To form the silicide contacts, a metal layer is deposited on the surface of the substrate. The metal layer, for example, may be cobalt or an alloy thereof. Other types of metallic layers, such as nickel, or alloys thereof, may also be used. The metal layer can be formed by Physical Vapor Deposition (PVD). Other types of metal elements that can be formed by other types of processes can also be useful.

A first anneal may be performed. The first anneal diffuses the metal dopants into the active substrate, forming a silicide layer. The first anneal, for example, is performed at a temperature of about 500° C. for about 30 seconds. Excess metal not used in the silicidation of the active surface is removed by, for example, a wet removal process. For example, unreacted metal material is removed selective to the silicide contacts. A second anneal may be performed to enhance the material properties of the silicide layer, for example, lower resistivity. The first and second annealing processes may be a rapid thermal anneal (RTA). Other annealing parameters or techniques may also be useful to form the silicide contacts.

Figure 3K:
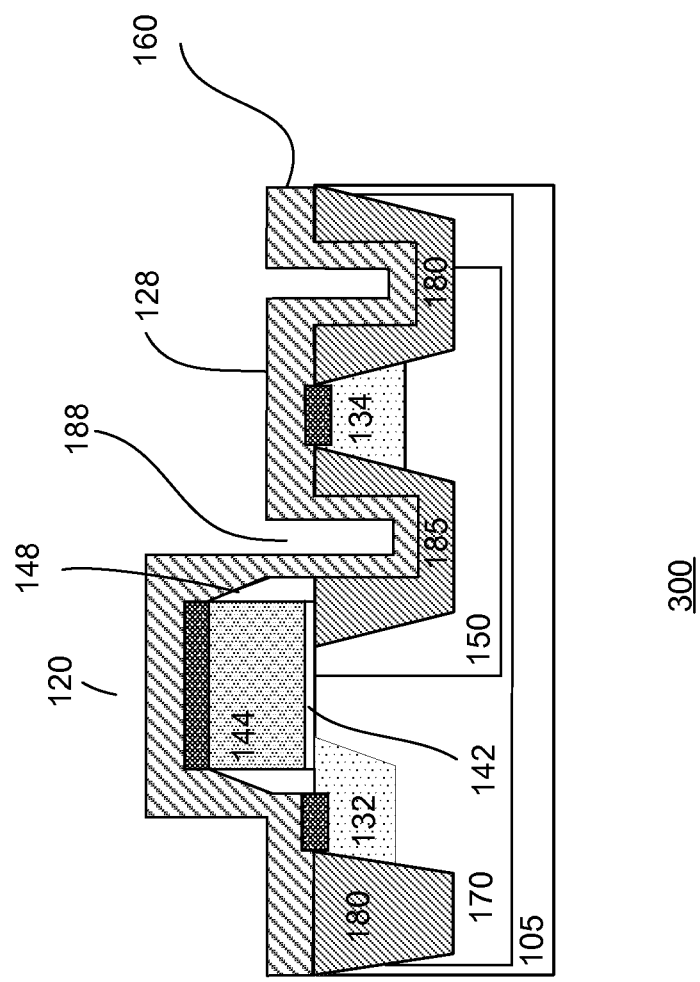
Figure 3I:
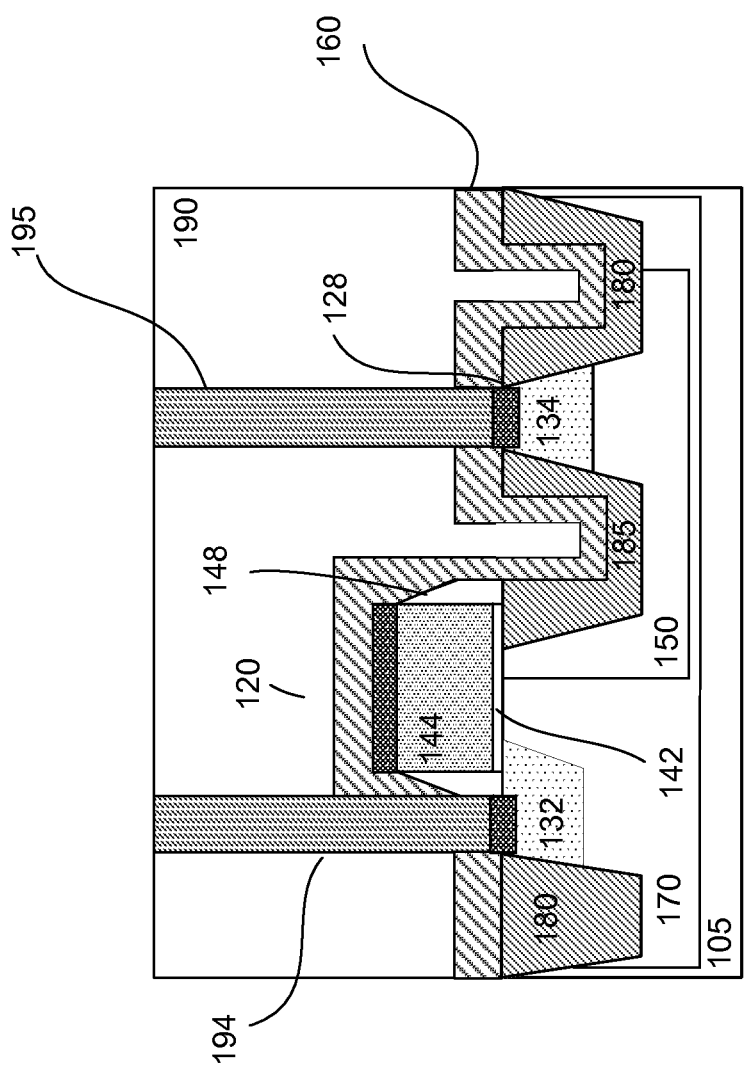

Referring to FIG. 3k, a dielectric ES stressor layer 160 is formed over the substrate. The ES stressor layer lines the substrate, transistors and secondary trenches in the isolation region. The ES stressor layer induces a first stress in the channel of a first type transistor. The first stress, in one embodiment, is a tensile stress for a n-type transistor. The tensile stress of the ES stressor layer improves carrier mobility for n-type transistor. In one embodiment, the ES stressor layer is a silicon nitride stressor layer. Other types of dielectric stressor layers may also be useful. Alternatively, the first stress is a compressive stress for a p-type transistor.

In one embodiment, the ES stressor layer lines the secondary trenches without filling them. For example, the ES stressor layer leaves a gap 188 in the secondary trenches. The thickness of the ES stressor layer, for example, is about 300-1000 Å. Other thicknesses may also be useful. The thickness of the ES stressor layer should be sufficient to enhance carrier mobility in the channel and drift region of the transistor. Various techniques, such as CVD, may be employed to form the ES stressor layer.

Referring to FIG. 3l, a dielectric layer 190 is formed on the substrate, covering the transistor and filling the gaps in the secondary trenches. The dielectric layer, in one embodiment, serves as a pre-metal dielectric (PMD) layer. The dielectric layer, for example, is a silicon oxide layer. In one embodiment, the dielectric layer is a high aspect ratio process (HARP) dielectric material. Other types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). The dielectric layer should be capable of selectively etched or patterned with respect to the ES stressor layer. The dielectric layer may be formed by, for example, CVD. Other techniques may also be employed to form the dielectric layer.

Contacts plugs 194 may be formed in the PMD layer. The contacts plugs, for example, are coupled to contact regions of the transistor. For example, contacts plugs are formed in the PMD layer to provide connections to the gate electrode (not shown), source and drain. The contact plugs, for example, may be tungsten contact plugs. Other types of conductive contact plugs may also be useful.

The contact plugs may be formed using a single damascene process. For example, via openings are formed in the PMD layer using, mask and etch processes, such as RIE. The via openings are filled with a conductive material, such as tungsten. Other types of conductive materials may also be useful. Excess conductive material is removed by, for example, CMP to form a planar top surface with exposed contact plugs in the via openings.

After the contact plugs are formed, an IMD layer is formed over the PMD layer. Trenches are formed in the IMD layer using mask and etch processes. The trenches correspond to conductive lines which are in communication with contact plugs in the PMD layer. The trenches are filled with a conductive material, such as copper of copper alloy. Other types of conductive materials may also be useful. Excess conductive materials are removed by, for example, CMP to provide a planar top surface with exposed interconnect lines. Other techniques for forming the conductive lines and plugs as well as the use of other types of conductive materials may also be useful. For example, reactive ion etch (RIE) techniques may also be used or a combination of RIE and damascene techniques may also be useful.

In other embodiments, contact plugs and conductive lines may be formed using a dual damascene process. For example, trenches and vias are formed in the dielectric layer and filled with a conductive material, such as copper or copper alloy. Other types of conductive materials may also be useful. Excess conductive materials are removed by, for example, CMP to provide a planar top surface with exposed interconnect lines.

The process continues to complete forming the device. For example, additional processes may be performed to complete the device. Such processes may include forming additional interconnect metal levels, final passivation, dicing, packaging and testing.

Figure 4A:
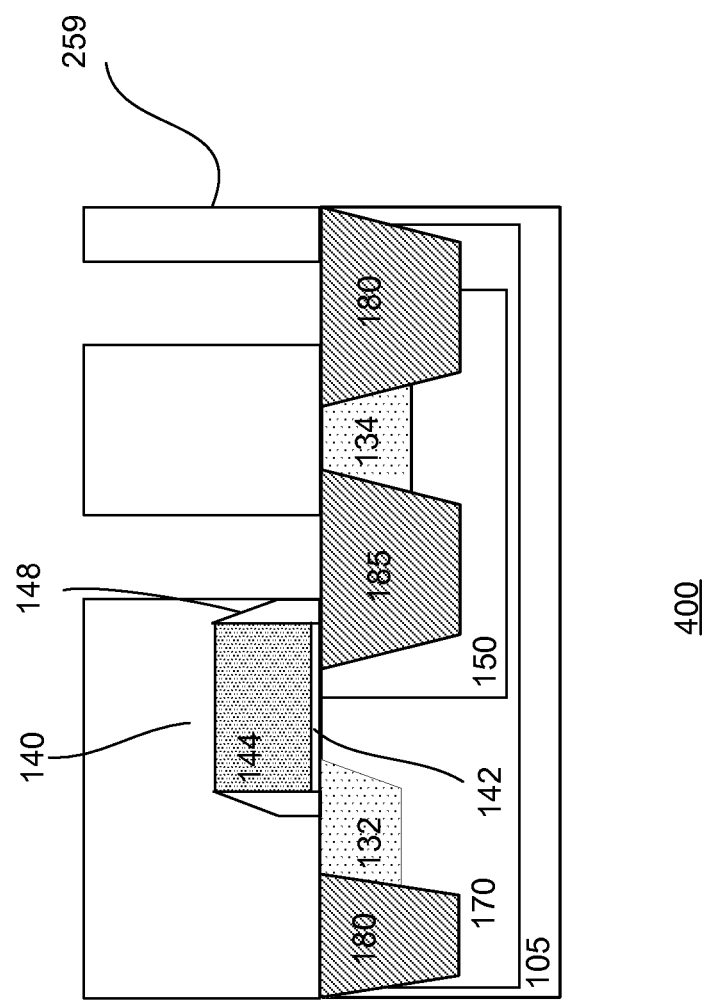

FIGS. 4*a-c* show cross-sectional views of another embodiment of a process 400 for forming a device or IC. The device and process is similar to that described in FIGS. 3*a*-1. As such common features may not be described or described in detail. Referring to FIG. 4*a*, a partially processed substrate 105 is provided. The substrate, as shown, is at the stage of processing as described in FIG. 3*h*. For example, a patterned mask layer 259 having openings correspond to location where secondary trenches are formed is provided on the substrate.

The patterned mask layer serves as an etch mask to form the secondary trenches. The etch removes the portions of isolation regions unprotected by the mask. The etch, for example, may be an anisotropic etch, such as reactive ion etch (RIE). Other types of etch processes may also be useful. In one embodiment, an RIE is employed to recess the isolation regions to form secondary trenches 187 in the isolation region, as shown in FIG. 4*b*. As shown, the isolation regions are recessed to form the secondary trenches. The isolation regions, in one embodiment, are fully recessed, exposing the substrate. For example, the depths of the secondary trenches and isolation regions are about the same. The depth of the secondary trenches in the isolation regions may be similar. Providing the secondary trenches of different depths in the isolation regions is also useful.

As shown in FIG. 4*c*, silicide contacts may be formed over the source, drain and gate electrode. After forming the silicide contacts, an ES stressor layer 190 is formed over the substrate. The ES stressor layer lines the substrate, transistors and the secondary trenches adjacent to the drain. The ES stressor layer induces a first stress in the channel of a first type transistor to improve carrier mobility. In one embodiment, the ES stressor layer lines the secondary trenches without filling them. For example, the ES stressor layer leaves a gap 188 in the secondary trenches. Various techniques, such as CVD, may be employed to form the ES stressor layer. Thereafter, the process continues as described in FIG. 3*l* and onwards.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate having a device region surrounded by a device isolation region, wherein the device region comprises a source region, a gate region and a drain region defined thereon;
   forming a gate in the gate region, a source in the source region and a drain in the drain region to form a transistor;
   forming an internal isolation region which comprises isolation material, wherein the internal isolation region displaces the drain from a drain side of the gate and underlaps a portion of the gate on the drain side of the gate;
   partially recessing the isolation material of the internal isolation region to form a first secondary trench in the internal isolation region, wherein a width of the first secondary trench is smaller than a width of the internal isolation region;
   forming an etch stop (ES) stressor layer over the substrate, wherein the ES stressor layer lines the transistor and first secondary trench without filling the first secondary trench to leave a trench gap; and
   forming a dielectric layer on the substrate, the dielectric layer covering the transistor and filling the trench gap over the ES stressor layer.

2. The method of claim 1 wherein the internal isolation region is formed along a channel width direction in the substrate between the gate and drain and the internal isolation region is formed simultaneously with the device isolation region.

3. The method of claim 2 comprises forming a drift well in the substrate between the gate and drain region, underlapping a portion of the gate.

4. The method of claim 3 wherein the drift well encompasses the drain and internal isolation region.

5. The method of claim 1 wherein the device isolation region isolates the device region from other regions of the device.

6. The method of claim 5 comprises forming a device well within the device isolation region.

7. The method of claim 6 wherein the device well encompasses the source, drain, drift well and internal isolation region.

8. The method of claim 1 wherein:
the first secondary trench extends to about 90-100% of the depth of the internal isolation region; and
the ES stressor layer induces a first stress on a channel and a drift well of the device.

9. The method of claim 1 wherein the ES stressor layer comprises dielectric material.

10. The method of claim 9 wherein the ES stressor layer comprises silicon nitride.

11. The method of claim 1 wherein the ES stressor layer induces a first stress on a channel and a drift well of the device.

12. The method of claim 11 wherein the device is an NMOS transistor, and wherein the first stress is a tensile stress.

13. The method of claim 11 wherein the device is a PMOS transistor, and wherein the first stress is a compressive stress.

14. The method of claim 1 wherein:
the source is adjacent to a source side of the gate;
the isolation material of the internal isolation region comprises a dielectric material; and
at least sidewalls of the first secondary trench are surrounded by isolation material of the internal isolation region.

15. The method of claim 1 comprising:
forming a second secondary trench in the device isolation region which is adjacent to and contact the drain region, wherein a width of the second secondary trench is smaller than a width of the device isolation region; and
forming the ES stressor layer also lines the second secondary trench without filling the second secondary trench.

16. A method of forming a semiconductor device comprising:
providing a substrate having a device region surrounded by a device isolation region, the device region comprises an internal isolation region, wherein
the device and internal isolation regions comprise isolation material, and
the device region comprises a source region, a gate region and a drain region defined thereon;
forming a gate in the gate region, a source in the source region and a drain in the drain region, the source and drain are disposed within the substrate and below the gate, wherein the drain is separated from a second side of the gate by the internal isolation region and the source is adjacent to a first side of the gate;
forming a first secondary trench in the isolation material of the internal isolation region and forming a second secondary trench in the isolation material of the device isolation region which is adjacent to and contacts the drain; and
forming an etch stop (ES) stressor layer over the substrate, wherein the ES stressor layer lines the first and second secondary trenches without filling the trenches.

17. The method of claim 16 comprises forming a drift well in the substrate between the gate and drain regions, wherein the drift well underlaps a portion of the gate.

18. The method of claim 16 wherein the ES stressor layer induces a first stress on a channel and a drift well of the device.

19. The method of claim 18 wherein the device is an NMOS transistor, and wherein the first stress is a tensile stress.

20. The method of claim 18 wherein the device is a PMOS transistor, and wherein the first stress is a compressive stress.

21. A method of forming a device comprising:
providing a substrate having a device region, wherein a device isolation region surrounds the device region;
forming a gate in the device region;
forming a first and a second heavily doped region in the device region, wherein the first and second heavily doped regions are disposed within the substrate adjacent to first and second sides of the gate;
forming an internal isolation region which comprises isolation material, wherein the internal isolation region displaces the second heavily doped region from a second side of the gate;
forming at least a first secondary trench in the internal isolation region, wherein a width of the first secondary trench is smaller than a width of the internal isolation region; and
forming an etch stop (ES) stressor layer over the substrate, wherein the ES stressor layer lines the first secondary trench without filling the first secondary trench.

22. The method of claim 21 wherein:
forming at least the first secondary trench also forms a second secondary trench in the device isolation region which is adjacent to and contacts the second heavily doped region; and
forming the ES stressor layer also lines the second secondary trench without filling the second secondary trench.

\* \* \* \* \*